(12) United States Patent
Miller et al.

(10) Patent No.: US 6,653,706 B1
(45) Date of Patent: Nov. 25, 2003

(54) LOW TEMPERATURE GROWN OPTICAL DETECTOR

(75) Inventors: David A. B. Miller, Stanford, CA (US); James S. Harris, Jr., Stanford, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 0 days.

(21) Appl. No.: 09/567,179

(22) Filed: May 8, 2000

(51) Int. Cl.$^7$ .............................................. H01C 31/00
(52) U.S. Cl. ........................................ 257/444; 257/448
(58) Field of Search ................................. 257/444, 448, 257/451, 461; 385/16

(56) References Cited

U.S. PATENT DOCUMENTS

| | | | |
|---|---|---|---|
| 4,332,469 A | | 6/1982 | Wendland .................... 356/222 |
| 4,542,289 A | | 9/1985 | Yokoyama et al. .......... 250/201 |
| 5,307,169 A | * | 4/1994 | Nagasaki et al. ............ 348/307 |
| 5,530,956 A | * | 6/1996 | Hiraoka et al. .............. 385/122 |
| 5,537,498 A | | 7/1996 | Bausman et al. .............. 385/24 |
| 5,568,574 A | | 10/1996 | Tanguay, Jr. et al. .......... 285/14 |
| 5,621,227 A | * | 4/1997 | Joshi ........................... 257/184 |
| 5,659,188 A | * | 8/1997 | Kao et al. .................... 257/190 |
| 5,850,195 A | | 12/1998 | Berlien, Jr. et al. .......... 341/137 |
| 5,889,903 A | | 3/1999 | Rao ............................. 385/14 |
| 6,320,893 B1 | * | 11/2001 | Ueki ............................ 372/96 |
| 6,355,976 B1 | * | 3/2002 | Faris ............................ 257/686 |
| 6,400,855 B1 | * | 6/2002 | Li et al. ......................... 385/4 |

FOREIGN PATENT DOCUMENTS

| | | | |
|---|---|---|---|
| DE | 3929018 A1 | 3/1991 | ............ H04N/3/15 |
| EP | 0447327 A2 | 3/1991 | |
| EP | 0519105 A1 | 12/1992 | ............. G01J/3/28 |

OTHER PUBLICATIONS

G. N. Nasserbakht et al.; "Monolithic integration of GaAs and Si bipolar devices for optical interconnect system;" IEEE 1992 Custom Integrated Circuits Conference, Publication Date: May 3, 1992.

* cited by examiner

*Primary Examiner*—Carl Whitehead, Jr.
*Assistant Examiner*—William C Vesperman
(74) *Attorney, Agent, or Firm*—Lumen Intellectual Property Services, Inc.

(57) ABSTRACT

A high efficiency optical interconnect (OI) deposited directly on a silicon based IC by a low temperature process that utilizes a heterogeneous crystalline structure of a III-V compound material to convert light pulses into electrical signals. The high efficiency is established by pulsing the light beams with a shorter duration than the life time of the generated carriers and by reducing the structural volume and consequently the internal capacitance of the III-V compound to a functional height of approximately 1 micron. The analog MSM characteristic of the OI is bypassed by differential two-beam signal processing, wherein the intensity difference of two synchronous light beams is transformed in two parallel OI's into two electrical signals that compensate in a central node. The resulting polarity in the node switches either a PMOS or a NMOS transistor, which connect either a positive or negative voltage to the output node.

13 Claims, 3 Drawing Sheets

LOW TEMPERATURE GROWN OPTICAL DETECTOR

NOMENCLATURE

1. Processed SiIC
2. Optional insulator layer
3. HIII/V layer
4. First electrode structure
5. Light beam area
6. Second electrode structure
7. OD length
8. OD width
9. Insulating distance
10. Second channel
11. First channel
12. HIII/V layer height
13. Insulator height
14. Gap width
15. A/B/C light pulse duration
16. A/B/C time-out interval
17. A/B/C gating duration
18. A/B/C extended duration
19. A/B/C charging duration
20. Carrier energy
21. Gating voltage
22. A/B/C time
23. A/B/C light pulses
24. A/B/C carrier energy levels
25. A/B/C gating curves
26. light intensity
27. Operational value
28. Gating level

1. Field of Invention

The present invention relates to the field of optical detectors grown on processed silicon based circuit structures.

2. Background of the Invention In modern computers the main processing load is handled by a number of silicon based integrated circuits (SiIC's) Those SiIC's are placed on boards that provide the electrical interconnections in the form of conductive traces. The boards are electrically connected to each other with connectors and wires.

Due to continuing development, the speed at which the SiIC's perform their logical operations is consistently rising. At the same time, more and more functions and features are provided by the computer, increasing the number and complexity of specific SiIC's that are brought into interaction with each other. As a result, the number of wires and traces, as well as their lengths, are also growing. Even though the signal speed outside the SiIC's is just a fraction of the internal speed, the amount and length of connectors, wires and channels, with their inductance and capacitance, impose a significant limitation on further development of faster SiIC's.

The logical operations within an SiIC are performed synchronously. For this reason, carefully designed channels have to provide all areas of the IC with clock signals. Distortions of the synchronous clock frequency are known as clock skew, which becomes more and more difficult to handle with increasing frequency and chip size. The clock signals are supplied to the SiIC via a peripheral junction and have to reach each destination over exactly the same distance. As a result, sophisticated channel distribution designs known as H-tree or fan-out designs occupy more and more space of the available SiIC area. In addition, the clock frequencies have reached levels at which local thermal differences affect the resistance and the travel speed of the clocking signal beyond acceptable tolerances. Furthermore, the placement of the clock channels partitions the SiIC and imposes a dimensional limitation on the design of the logical circuitry.

Optical data transmission bypasses the problems imposed by electrical wires and channels. Optical data transmission speed is highly independent of transmission distance and thermal influences. Other advantages include, for instance: no sensitivity to electronic noise, no capacitance or inductance in the transmission paths, no signal interference, vertical accessibility of SiIC's, and electric decoupling between individual electronic components.

A number of inventions provide for optical data transmission between SiIC's for data and signal communication as well as for distribution of clock signals. To utilize the advantages provided by optical data transmission to their utmost, it is essential to transform the optical signal into an electric signal as close as possible to the location of the logical operation. The devices that perform the transformation are called optical interconnects (OI's). They transform a received coherent light beam into a carrier energy with a distinct voltage or vice versa. In the specific form of a metal-semiconductor-metal detector (MSM-detector), the carrier energy is a gating voltage between two metallic electrodes. The conductivity created thereby is in approximate proportion to the intensity or energy of the received light beam. The efficiency of the transformation is defined by the ratio between the energies of the received light beam and that of the generated carrier energy. OI's can be either emitters or modulators, which convert an electrical signal into an optical signal, or optical detectors (OD), which convert a received optical signal into an electrical signal. A combination of both is also possible, even though the specific and differing tasks emitters and receivers have to perform lead more towards specifically designed and independently performing OD's.

U.S. Pat. No. 5,537,498 discloses an optical clock distribution system, whereby a bulky OD is brought into close proximity to the location of the logical operation within the SiIC. Conductive channels transmit the converted electrical clock signals from the OD to an electrical subsystem, wherein the clock signal is tuned and distributed over equalized fan-out paths to the final sites of the SiIC. The bulky design of the OD does not allow positioning close to the final destinations of the clock signals, which results in excessive lengths of conductive channels. Consequently, the clock signal has to be additionally tuned, which degrades the advantages achieved by optical clock distribution.

Another invention, disclosed in U.S. Pat. No. 5,568,574, presents modular-based photonic chip-to-chip interconnections for dense three-dimensional multichip module integration. A number of stacked SiIC's is thereby brought into signal communication by placing OD's on their opposing surfaces in congruent arrays, such that they can directly exchange optical signals. The OD's are pre-fabricated and flip chip bonded onto the processed SiIC. They are dimensioned far beyond the sizes required for their operational function in order to have sufficient size for physical placement and the mechanical robustness necessary for the bonding process. As a result, they have an unnecessarily high internal capacitance that has to be charged each time an optical signal is received and converted into an electrical signal. The response time of such an OI is relatively long, and a significant part of the converted electrical energy is consumed to charge the capacitance. Furthermore, the conductive state of an OD such as an MSM-detector fades over an extended time period, which causes the transmitted signal also to fade and to lose its crispness. In summary, the capacitance imposed by the bulky design of the OD degrades the signal coherence such that additional circuitry becomes necessary to compensate for this shortcoming.

Since logical operations are mainly performed within silicon-based IC's (SiIC's), there are attempts to also utilize Si-based materials for OD's. to integrate them together with the logical circuitry. The integration of OD's and logical circuitry in close proximity reduces the conductive path of the electric signal to the location of the logical operation to a minimum, and the capacitance in the channels is thereby kept at a very low level.

For example, U.S. Pat. No. 5,889,903 discloses a method and apparatus for distributing an optical clock in an integrated circuit. A coherent light beam is split and directed onto several OD's, which are distributed over the planar structure of an SiIC. The coherent light beam is pulsed with a clock frequency, which is synchronously converted in each of the OD's into a number of individual electrical clock signals. Hence, all logical circuits of the SiIC operate synchronously, driven by their individually derived clock signal. Unfortunately, the low efficiency of the SiOD's necessitates the use of amplifiers and buffers, which impose with their capacitance and subsequently with their time delay a latency onto the transmission path between the OI and the clock signal destination, and compromise the overall synchronicity in the SiIC.

Preferred materials for OI's with a high conversion efficiency are III-V compound materials (III-V) based, for instance, on Gallium-Arsenide (GaAs) or Indium-Gallium-Arsenide (InGaAs). Unfortunately, their integration onto or within processed SiIC's is problematic. First, because III-V's have a different crystallographic lattice constant than Si, it is difficult to grow defect-free epitaxial structures. Secondly, the environment to grow III-V layers is highly destructive to a fully processed SiIC: the temperature of the environment is at a level at which metallizations are altered or destroyed, and at which the detailed structure of transistors would be altered substantially during the III-V growth. Oxidized Si also loses its insulating characteristic in the presence of gallium. It is not possible to deposit the III-V compound OI's at an early stage of the SiIC manufacturing because of specific processing requirements. Once compounds containing gallium have been added to the SiIC, it is undesirable to return the SiIC to the SiIC production sequence, because the gallium may contaminate the SiIC production line.

To bypass and overcome the obstacles described above, sophisticated intermediate fabrication steps could be implemented. However, the whole manufacturing process would become too complex and would not be feasible for industrial fabrication of integrated OI's.

To avoid these problems, processes known as wire bonding, solder bumping, flip chip bonding or atomic rearrangement are used to bind a pre-manufactured GaAs- or InGaAs-OI onto a processed SiIC. The physical manipulation and the binding processes required for this imply disadvantageous dimensioning of the OI as described in U.S. Pat. No. 5,568,574. III-V materials are usually grown on III-V substrates, but such substrates have different thermal expansion coefficients from silicon, which makes bonding of large III-V and Si substrates difficult, and specifically makes precise bonding difficult. Techniques such as wire bonding, flip chip bonding, and solder bumping also require significantly large dimensions or lengths of bonds, which increase both capacitance and inductance and reduce the performance.

Therefore, there exists a need to provide OI's from III-V compound materials deposited directly on a fully processed SiIC. The current invention addresses this problem.

One shortcoming of optical data transmission is the attenuation in the optical transmission path, which can vary due to aging processes or hazardous operational conditions. It is also dependent, for example, on the transmission length, the number of connectors, and the transmission media.

Therefore, there also exists a need for reliable optical signal transmission that is independent of intensity discrepancies of light beams received within an OD. The current invention addresses this problem also.

Objects and Advantages

Accordingly, it is a primary object of the present invention to place an OD in close proximity to the location of a logical operation within a SiIC.

It is a further object of the present invention to provide an OD with a minimal internal capacitance.

It is a further object of the present invention to provide an OD with a high efficiency.

It is yet another object of the present invention to provide an OD device unaffected by intensity fluctuations of the received optical signal.

The above objects and advantages, as well as numerous improvements attained by the apparatus and method of the invention, are pointed out below.

SUMMARY OF THE INVENTION

III-V compounds can be deposited at temperatures around 250 degrees Centigrade instead of the usual 600 to 700 degrees. This so-called low temperature process has been utilized to grow GaAs, for instance as buffer layers on a GaAs substrate. Layers deposited at those low temperatures have an excess concentration of As (or the group V element) as well as a high concentration of growth defects which render the crystalline structure highly heterogeneous. The advantage of the low temperature growth is that it can be performed on fully processed SiIC's without risking their destruction.

The present invention provides an optical switching device grown on a fully processed circuit structure, preferably made from silicon-based material. The device has the following layers: a template layer, preferably electrically insulating, on the circuit structure; a heterogeneous crystalline layer grown on top of the template layer at a low temperature (200–250° C.) ; and at least one top layer with a number of electrode areas and deposited on the crystalline layer. The top layer preferably has a predetermined refractive index. The template layer may be deposited on the processed circuit, or the circuit may be selectively etched to form the template layer.

The heterogeneous crystalline layer may be a GaAs, InGaAs, or InGaNAs material. It preferably has a predetermined electrical resistance, and receiving a light beam can reduce the resistance to initiate a temporary conductivity in the layer for a distinct conduction duration. During the conduction duration, the device has a capacitance with a distinct charging duration from a current flowing between the electrode areas. Preferably, the charging duration is shorter than or equal to the conduction duration.

The device may also have an additional layer above or below the heterogeneous crystalline layer. The additional layer has a wider bandgap than the heterogeneous crystalline layer, and therefore provides electron and hole confinement and passivation to surface and interface recombination.

An epitaxially grown III-V compound material(III-V) has a highly absorbing characteristic for light at wavelengths desirable for optical interconnects. Hence, the received light beam can be absorbed relatively completely, even within a thin layer of III-V material, efficiently generating electrons and holes, or charge carriers. The carriers are able to travel to establish a conductive state between adjacent electrodes and perform thereby the switching function of the OD. When a traveling carrier hits a defect or impurity it can recombine. Defects and impurities are numerous in heterogeneous crystalline III-V (hIII/V) compound structures, such that the average lifetime of carriers generated in layer is very short. The efficiency of light beams with a duration as presently utilized for known OD's would be therefore too low in hIII/V layers.

Lasers when modelocked produce pulsed light beams with a duration that is a fraction of that in conventional OD's. Such pulses can effectively be modulated to carry information using high speed mirroring devices such as reflective quantum well modulators. The modulators and the associated electrical drive signals only have to operate at the repetition rate of the pulses, not at the short time scales of the pulse duration, to allow different information to be carried on each pulse.

This possibility is utilized in the current invention to create an OD for coherent light beams with a duration that is shorter than the average lifetime of the carriers within a hIII/V layer. The thereby generated carrier pulses are short in duration and sum to low numbers of carriers. The structure is, in a preferred embodiment, designed so that the generated carriers are substantially transported to the electrodes in a time shorter than or comparable to the average lifetime of the carriers within a hIII/V layer. Thus, the carriers are able to discharge the device capacitance efficiently before they would otherwise have recombined, and the short lifetime of the generated carriers does not substantially prevent an OD that is efficient. The short recombination time of the carriers ensures also that the device is very fast, being ready rapidly to receive another pulse of information. The discharging of the device capacitance creates a voltage electrical signal as required for the optical interconnect operation.

The device described above is made by depositing a template layer on a processed semiconductor, growing a heterogeneous crystalline layer of III-V compound related material on the template in a low temperature growing environment, and depositing a number of electrical and optical operating layers on top of the III-V compound related material. An additional step of annealing the device at a temperature of between 250 and 400° C. for a short time period may occur after the layer is grown.

The invention is used to provide signals from single pulsed light beams either for data transmission or as clock signals.

The present invention also provides a method for converting a pulsed light beam with a minimum pulse duration into an electrical switching signal with a switching duration that is at least equal to the pulse duration. The method has the following steps: pulsing the light beam; directing the light beam into the heterogeneous crystalline layer structure described above, thereby altering the conductivity of the layer and initiating a current flow between electrodes deposited on the layer; charging a capacitance of the structure; and transmitting the current flow between the electrodes to a gate terminal of a transistor that is conductively connected to at least one of the electrodes.

The present invention also provides a converting device incorporating the optical switching device described above.

The converting device converts a number of periodically alternating intensity differences of first and second light beams into a number of digital electrical signals with two predetermined voltage values, corresponding to the two logical values of a bit: a "1" and a "0". The converting device includes: first and second optical switching devices (or optical interconnects (OI's)) for receiving first and second light beams, respectively; a positive voltage supply channel connected to a first primary electrode of the first OI and to a first primary terminal of an n-switched transistor (preferably PMOS); a negative voltage supply channel connected to a second primary electrode of the second OI and to a second primary terminal of a p-switched transistor (preferably NMOS); a central node connected to a first secondary electrode of the first OI, to a second secondary electrode of the second OI, to a first gate of the p-switched transistor, and to a second gate of the n-switched transistor; and an output channel connected to a first secondary terminal of the p-switched transistor and a second secondary terminal of the n-switched transistor. The converting device is used for differential signal processing of the two light beams. The two received beams have complementary intensities that are converted into an electrical signal with a poling value that corresponds to the difference between the two intensities. Preferably, the electrical signal has a voltage level that depends on the two intensities. Depending on the poling value, the output channel is connected with either a positive or negative source voltage.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon the claimed invention.

Figure 1:
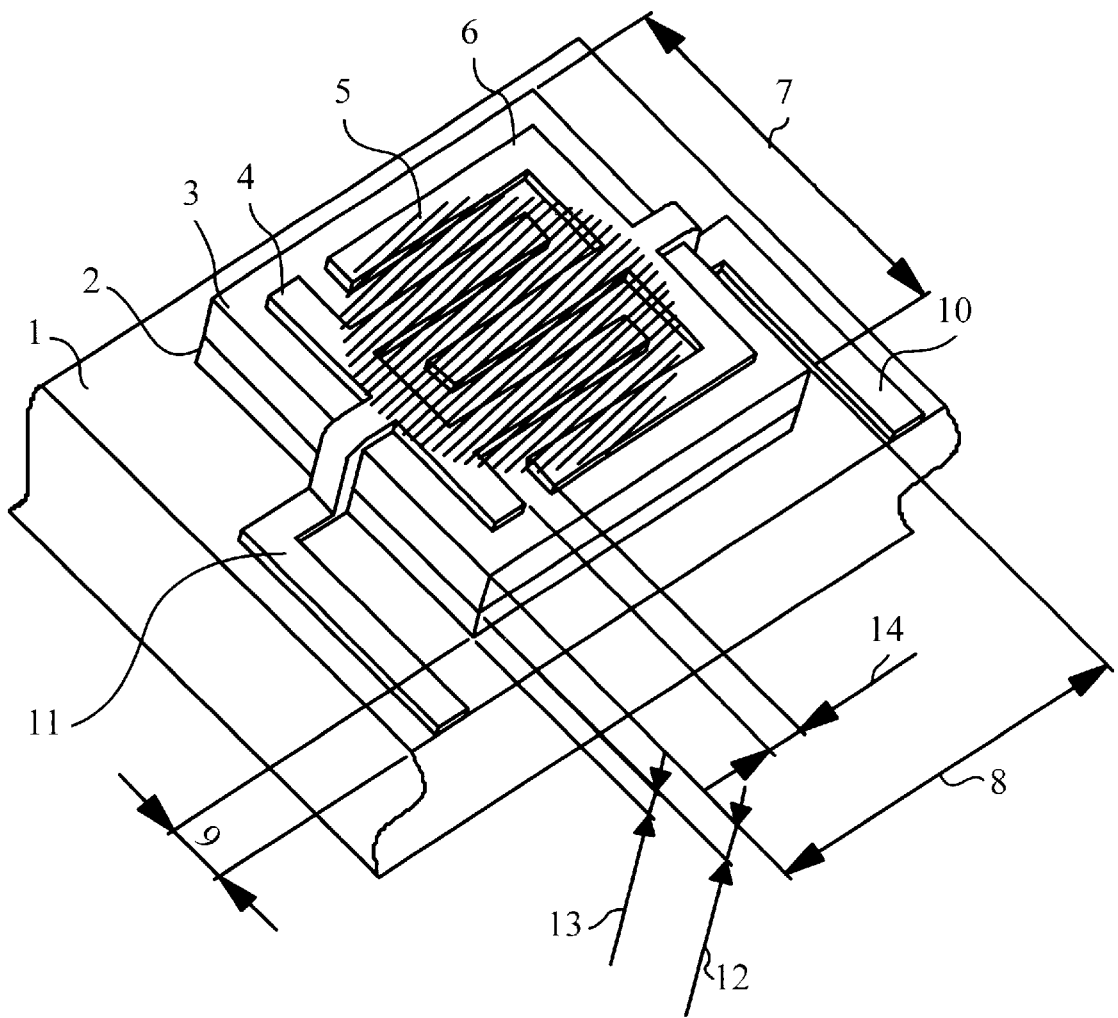
FIG. 1 shows the invention in a simplified perspective view.

FIG. 1 shows the inventive optical detector (OD) in a simplified perspective view placed on a fully processed silicon based integrated circuit (SiIC) 1. The SiIC 1 is shown in a fragmental view, extending laterally on both sides of the OD length 7 and the OD width 8. A first and a second channel 11, 10 of the SiIC 1 are conducive traces connected to a first and a second electrode structures 4, 6, which are grown on top of a layer of heterogeneous crystalline structure made from III-V compound material (hIII/V layer) 3. Layer 3 may be GaAs, InGaAs, InGaNAs, or other suitable III-V compound material. The hIII/V layer 3 is shown in FIG. 1 deposited on an optional insulator or template layer 2. It is appreciated that anybody skilled in the art can deposit the hIII/V layer 3 without the optional insulator or template layer 2 on the SiIC 1 without diverting from the scope of the invention.

The optional insulator layer 2 has an insulator height 13 and the hIII/V layer 3 has a hIII/V layer height 12. A light beam area 5 marks with hatched lines an exemplary area on the top of the OD where a coherent light beam is received. An insulating distance 9 shows the closest distance to any further logical circuitry supplied with electrical signals via first and second channel 11, 10.

The device may also have an additional layer above or below the hIII/V layer 3 (not shown). The additional layer has a wider bandgap than the heterogeneous crystalline layer, and therefore provides electron and hole confinement and passivation to surface and interface recombination of carriers. For example, when the layer 3 is GaAs, the wider bandgap material may be AlGaAs or InGaP. When the layer 3 is InGaAs or InGaNAs, the wider bandgap material may be GaAs or AlGaAs.

The fabrication of the SiIC 1 involves several operational steps, wherein a number of different layers are deposited, patterned, etched, doped and metallized. As discussed above, the growth of conventional III-V material layers after the complete SiIC fabrication process is impossible because Si surface cleaning before III-V growth involves temperatures of about 800° C., followed by growth temperatures of about 600° C. Such temperatures for growing conventional III-V layers on Si will completely destroy the metallization in the SiIC and possibly damage the transistors themselves. The growth of conventional III-V material layers as part of the sequence of the SiIC fabrication process is undesirable, because the III-V materials are considered contaminants in the SiIC process, degrading device and insulation properties. Additionally, there are only very few points late in the SiIc process where the III-V process could be inserted, because of the very high temperatures employed at some stages of the SiIC fabrication process, which would completely destroy some of the III-V materials.

A possible work-around to this problem has been to deposit GaAs by conventional means on a nearly completed SiIC (lacking final metallization), as described in G. N. Nasserbakht et al., "A Monolithic GasAs-on-Si Receiver Front-End for Optical Interconnect Systems," *IEEE Journal of Solid-State Circuits*, 28(6), 622–630, 1993. However, this meant that final via etching and metallization had to be completed outside the Si fabrication process line on entirely separate and dedicated equipment, which proved to be technically unsatisfactory. The present invention takes an entirely different approach to solve this processing compatibility problem.

The optional insulation or template layer 2 is, for instance, deposited at an early stage from aluminum-arsenide and oxidized after the hIII/V layer 3 has been grown on top of it. The technique used is well known to those skilled in the art. The insulation layer 2 insulates the hIII/V layer 3 against eventual capacitative structures of the processed SiIC 1 and helps to keep the total operational capacitance low. Alternatively, the template layer may be formed by selectively etching protective insulating layers of the SiIC 1 down to the native semiconductor substrate.

After all functional layers of the SiIC 1 have been deposited, including first and second channels 11, 10 and the optional insulator layer 2, the wafer is exposed to an environment of approximately 200–250 degrees Centigrade and the hIII/V layer 3 is grown. The hIII/V layer height 12 has an approximate value of 1 micron. The temperature resistance of a processed SiIC up to 350 degrees Centigrade allows a safe low temperature deposition at 200–250 degrees Centigrade thereon.

Next, an optional annealing step may be performed at a temperature between 250 and 400° C. The annealing step provides control over the carrier lifetime in the hIII/V layer 3. For some applications, it is desirable to decrease the carrier lifetime, and annealing causes a decrease in carrier lifetime and an increase in carrier mobility. Annealing occurs for a short time, between 10 seconds and 1 minute, such as 30 seconds. When the optional wider bandgap materials are included above or below the hIII/V layer 3, the carrier mobility and lifetime are more controllable, and the annealing step is therefore particularly desirable. However, the annealing step is also beneficial when the optional layers are not included.

On top of the hIII/V layer 3 first and second electrode structures 4, 6 are deposited as it is well known to those skilled in the art. First and second electrode structures 4, 6 are conductively connected to the first and second channels 11, 10.

The OI of this invention works in accordance with the principle of a metal-semiconductor-metal (MSM) detector as is well known to those skilled in the art.

FIG. 1 shows only layers and structures of the OD that are essential to the invention. Any other layers and structures added to assure the function and efficiency of the device are known to those skilled in the art and are not shown for reasons of clarity.

During the operation of the OD a pulsed coherent light beam of a wavelength of preferably 800 nm is received in the light beam area 5. The light beam enters the hIII/V layer 3 in the exposed areas with the gap width 14. Lenses or optical fibers (not shown) may be used to deliver the light to the electrode area efficiently.

The heterogeneous crystalline structure of the hIII/V layer 3 has a high optical absorption coefficient for wavelengths shorter than a bandgap wavelength, which makes it highly opaque. The received light beam attenuates therefore after a short traveling distance within the hIII/V layer 3.

The high concentration of excess As and defects in the hIII/V layer 3 causes the generated carriers to recombine very quickly. During the very short lifetime of the carriers, the hIII/V layer 3 becomes highly conductive, and a current flows between first and second electrode structures 4, 6. This current discharges the capacitance of the structure, establishing a gating voltage between the first and second electrode structures 4, 6. This process additionally discharges the capacitance of first and second channel 11, 10. Due to the short distance of first and second channel 11, 10 and the small capacitance of the MSM structure, the total operational capacitance remains at a value low enough to be discharged by a fraction of the carriers.

To design the device for efficient operation, the device electrodes are spaced close together, and sufficient voltage is applied. For example, with electric fields exceeding $10^4$ V/cm, a typical carrier velocity is of the order of $10^7$ cm/s. $10^7$ cm/s corresponds to traversing 1 micron in 10 picoseconds. $10^4$ V/cm corresponds to 1 V in 1 micron. Hence, if the electrodes are spaced approximately 1 micron or less apart, and 1 V or more is applied between the electrodes, the device can be expected to sweep out the carriers efficiently in about 10 picoseconds or less. If the average lifetime of the carriers in the hIII/V layer 3 is of the order of 10 picoseconds, an efficient high-speed OD results.

Because of the short attenuation length of the received light beam in the hIII/V layer 3, the opto-electronic transformation takes place very close to the layer surface. As a result, an OD that works according to the principles of the current invention needs to be only a fraction as thick as existing OD's made from silicon. The capacitance of the hIII/V layer 3 is therefore reduced and the low energy of an individual carrier pulse is still sufficient to charge the internal capacitance and to establish the desired conductive state between the electrodes.

OD's made from hIII/V can be built up on processed SiIC 1 in close proximity to processing sites of the transformed signals. The close proximity reduces additional capacitances that would otherwise result from long connecting wires. Smaller total capacitance results in larger voltages presented to the input of subsequent electrical circuits, improving system performance. Performance improvements include the need for less signal gain in electronic amplifiers, thus reducing the number of gain stages required, which in turn reduces the power dissipation and delay (also known as latency) in the system. The reduction in latency means that synchronicity is achievable within the circuitry with less constructive efforts.

Figure 2:
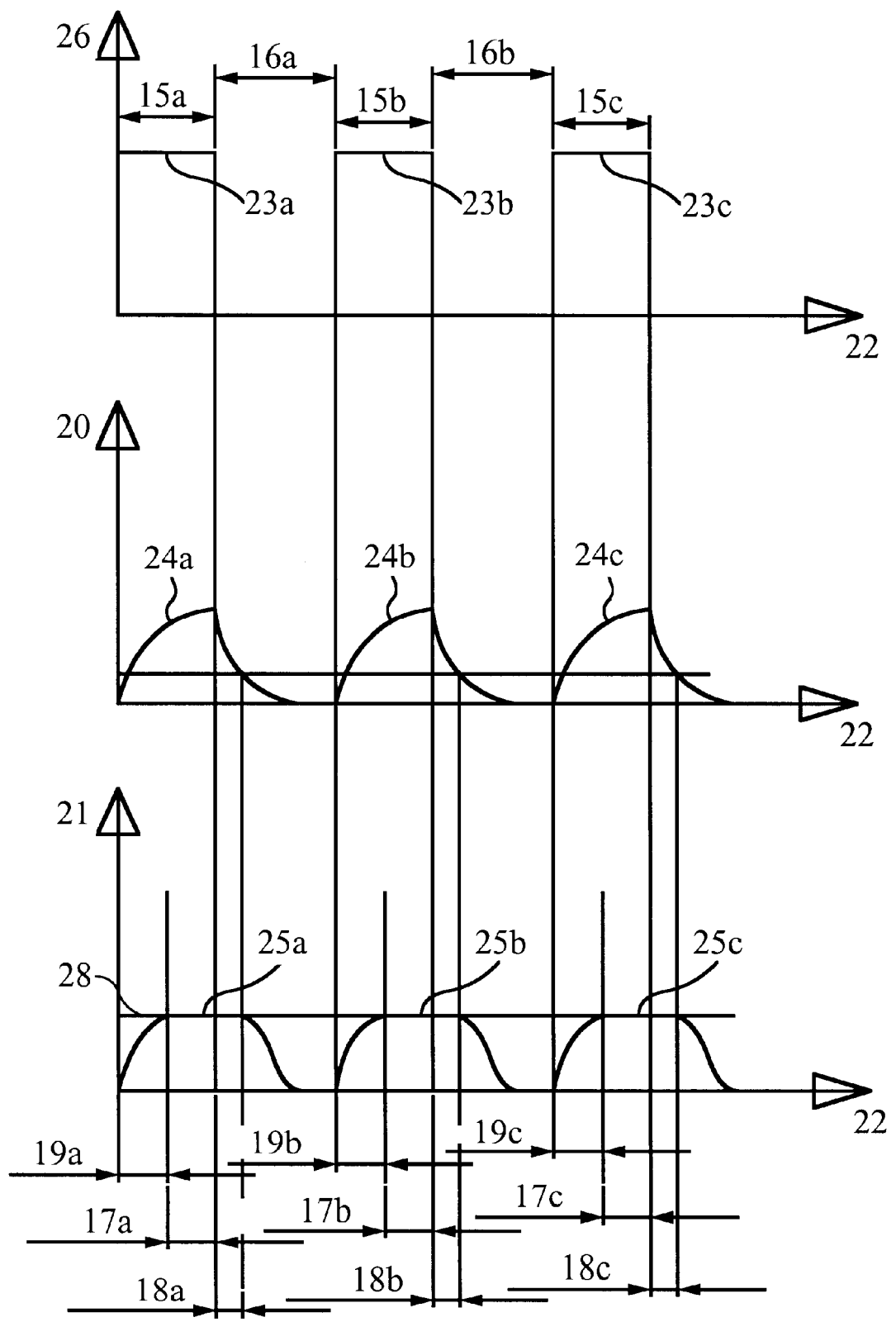
FIG. 2 shows in a diagram form the time relation between receiving light pulses, generated carrier flow and gating voltage of the OD.

FIG. 2 shows a diagram with three individual graphs, which represent the synchronous events of: first, a number of light pulses 23a, 23b, 23c, received in the hIII/V layer 3; second, a number of generated carriers represented by the carrier density curves 24a, 24b, 24c; and third, a number of gating voltages represented by the gating curves 25a, 25b, 25c. The diagram captures and visualizes an exemplary time period during which the three light pulses 23a, 23b, 23c are received by the OD. All curves are out of proportion and serve only as principal representations of the optical and electrical events within the hIII/V layer 3.

The top graph represents with its vertical axis a light intensity 26 and with its horizontal axis the elapsed time 22. During light beam introduction or illumination 15a, 15b, 15c, the light pulses 23a, 23b, 23c are imposed on the OD. During the time-out intervals 16a, 16b, no light impinges on the OD. Only the intensity level 26 of the light pulses 23a, 23b, 23c is attenuated in the optical transmission path, so the pulse shape is retained during optical transmission. The signals also remain noise free and are therefore very suitable for high clocking frequencies.

The middle graph represents carrier density or number 20 with its vertical axis and elapsed time 22 with its horizontal axis. At the moment the light pulses 23a, 23b, 23c reach the hIII/V layer 3, carriers are generated within the hIII/V layer 3. The carriers are represented in their density or number by the carrier level curves 24a, 24b, 24c. The initial density or number rises during the optical absorption process and then decays rapidly, represented by the falling levels of the carrier density curves 24a, 24b, 24c. In a short time after the end of the light pulses 23a, 23b, 23c, the hIII/V layer turns back into an insulator.

The bottom graph represents on its vertical axis 21 the gating voltage 21 and on its horizontal axis the elapsed time 22. In this example, the capacitance of the structure is presumed to be recharged by a resistor or an effective resistance such as the input impedance of an amplifier (not shown). The gating curves 25a, 25b, 25c represent the change in the voltage level between the first and second electrode structures 4, 6. The bottom graph shows also a gating level 28, which represents the operational voltage level necessary to trigger a logic circuit connected to the output of the device (possibly through intervening amplifiers).

During each charging cycle 19a, 19b, 19c, the generated carriers cause conduction to be established in the hIII/V layer 3. The optional insulation layer 2 insulates the hIII/V layer 3 against potential adjacent conductive structures of the processed SiIC 1, which may also increase the internal capacitance. The total number of generated carriers is sufficient to charge the internal capacitance and to establish a gating voltage 21 at the gating level 28 during the gating duration 17a, 17b, 17c. Due to the rapid change of the hIII/V layer 3 into an insulator when the optical signal is not present, as described above, the conduction in the hIII/V layer rapidly disappears, and the gating voltage returns to its original level after the extended illumination duration 18a, 18b, 18c, which extends into the time-out intervals 16a, 16b, 16c. The gating voltage returns to its original level by recharging through an external circuit (which may include a resistor or an amplifier input). The charging durations 19a, 19b, 19c represent the latency of the OD.

The efficient light conversion of the current invention results in a highly analog conversion characteristic. This means that a light beam with the same physical properties as a second light beam but with a different intensity results in a different gating voltage within the OD. Subsequently, the switched current has a voltage level that depends on the intensity of the received light beam. Since the light beams have a number of obstacles (e.g. optical elements) in their transmission path that often switch with time, their intensity attenuation is hard to calculate and to compensate. Usually, a number of electronic circuits, such as automatic gain control circuits, are used to compensate for this time varying effect. All of these circuits impose an additional latency in electrical signal transmission. The use of automatic gain control circuits also prevents the sending of very long sequences of logic zeroes or very long sequences of logic ones. Either of these sequences is interpreted as a change in the background average power level of the system rather than the logic sequences they actually are. As a result, it is necessary to code the data to prevent the occurrence of such sequences. Such coding results in additional circuit complexity and latency.

To compensate the highly analog conversion characteristic with a minimal use of electrical circuitry, the invention utilizes two OD's, each of them receiving a synchronous light beam with complementary intensities. In one embodiment, the two possible combinations of the intensity levels correspond to the two logical values of a bit: a "1" and a "0". The first OD is connected to a positive voltage source and a central node. The second OD is connected to a negative voltage source and the central node. The central node is connected to the common gate node of a CMOS transistor pair consisting of a positive voltage switched transistor (NMOS) and a negative voltage switched transistor (PMOS). Depending on which of the two OD's receives the light beam with the higher intensity, either a positive or a negative voltage dominates in the central node. As a result, either the PMOS switches a positive voltage to an electrical output, or the NMOS switches a negative voltage to the electrical output. Such a dual input differential pair always produces a maximum positive or negative signal by acting as a switch, rather than producing a weak signal of varying amplitude that is amplified. Such a pair provides lower bit error rates and minimum possible latency.

Figure 3:
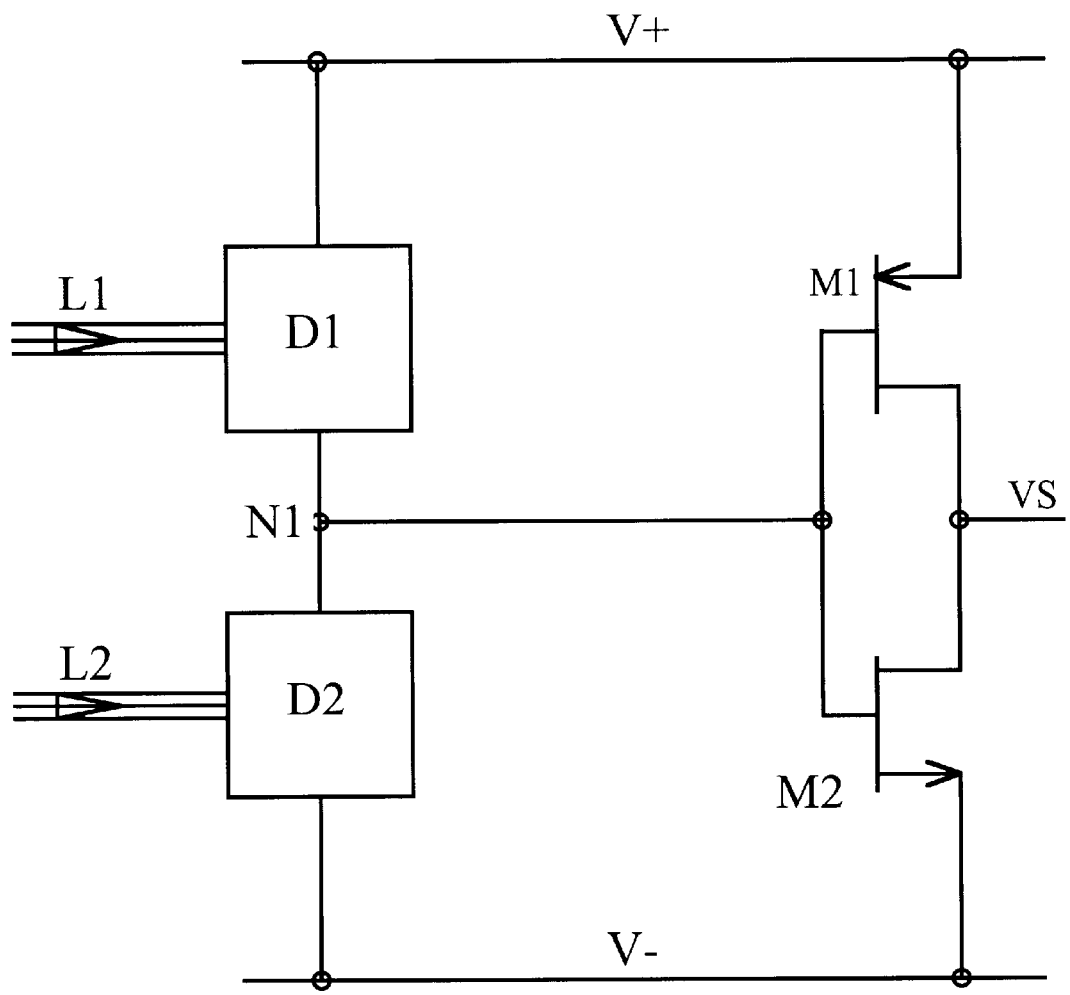
FIG. 3 shows an example circuit in an implementation of the invention for differential two-beam signaling.

FIG. 3 shows a schematic functional diagram of an implementation of the current invention to utilize two synchronous light beams with complementary intensity levels for a differential signal processing of two light beams. An OD D1 is placed to gate between a positive voltage source V+ and a central node N1. An OD D2 is placed to gate between a negative voltage source V− and the central node N1, which is conductively connected to a negative voltage switched (n-switched) transistor M1 and a positive voltage switched (p-switched) transistor M2. M1 is preferably a PMOS transistor (PMOS) and M2 is preferably a NMOS transistor (NMOS) as they are known to those skilled in the art. M1 is switching the positive source voltage V+ to the electrical output VS. M2 is switching the negative source voltage V− to the electrical output VS.

Two time synchronous light beams L1 and L2 are used in this implementation. The light beam L1 is received on D1. The light beam L2 is received on D2. The light beams L1 and L2 have complementary intensity levels defining two different logic levels, which correspond to the digital bit values "1" and "0". Those two different logic levels are passed on from the optical to the electrical level by D1 and D2, whereby two different conditions are utilized: firstly, D1 receives L1 with a high intensity, which results in a high gating level 28 between V+ and N1. Consequently, D2 receives simultaneously L2 with a low intensity, which results in a low gating level 28 between V− and N1. Hence, V+ dominates in N1, which causes M2 to connect V− to VS. Second, D2 receives L2 with a high intensity, which results in a high gating level 28 between V− and N1. Consequently, D1 receives simultaneously L1 with a low intensity, which results in a low gating level 28 between V+ and N1. Hence, V− dominates in N1, which causes M1 to connect V+ to VS. The differential signal processing bypasses the problem of inconsistent intensity levels of optically transmitted signals and the specific analog relation between light intensity and gate voltage in the current invention.

When light beams L1 and L2 are created at the same source location and are exposed to the same attenuation in the transmission path, their intensity levels relative to each other remain qualitatively unaltered. In addition, the current inventive application makes the electrical output independent of the intensity of a light beam received in an OD. A high signal to noise level is also achieved in this implementation.

It will be clear to one skilled in the art that the above embodiment may be altered in many ways without departing from the scope of the invention. Accordingly, the scope of the invention should be determined by the following claims and their legal equivalent.

What is claimed is:

1. An optical switching device grown on a fully processed integrated circuit structure, said optical switching device comprising:

A) an electrically insulating template layer on said processed integrated circuit structure;

B) a heterogeneous crystalline layer grown on top of said template layer; and

C) at least one top layer deposited on said heterogeneous crystalline layer, said at least one top layer comprising a number of electrode areas;

wherein said heterogeneous crystalline layer has a predetermined electrical resistance capable of being reduced to create a temporary conductivity of said heterogeneous crystalline layer and wherein said heterogeneous crystalline layer has carriers with an average lifetime of 10 picoseconds or less.

2. The optical switching device of claim 1, wherein said heterogeneous crystalline layer is a gallium-arsenide based material.

3. The optical switching device of claim 1, wherein said heterogeneous crystalline layer is an indium-gallium-arsenide based material.

4. The optical switching device of claim 1, wherein said heterogeneous crystalline layer is an indium-gallium-nitrogen-arsenide based material.

5. The optical switching device of claim 1, further comprising an additional layer above said heterogeneous crystalline layer, said additional layer having a bandgap wider than a bandgap of said heterogeneous crystalline layer.

6. The optical switching device of claim 1, further comprising an additional layer below said heterogeneous crystalline layer, said additional layer having a bandgap wider than a bandgap of said heterogeneous crystalline layer.

7. The optical switching device of claim 1, wherein said processed circuit structure is made from silicon based material.

8. The optical switching device of claim 1, wherein said template layer is electrically on said processed circuit structure.

9. The optical switching device of claim 1, wherein said at least one top layer has a predetermined refractive index.

10. The optical switching device of claim 1 wherein at least one of a number of received light beams initiates said temporary conductivity for a distinct conduction duration.

11. The optical switching device of claim 10, whereby said device has a capacitance at a time of said temporary conductivity.

12. The optical switching device of claim 11, whereby said capacitance has a distinct charging duration from a current flowing between said electrode areas.

13. The optical switching device of claim 12, whereby said distinct charging duration is equal to or shorter than said distinct conduction duration.

\* \* \* \* \*